(12) United States Patent
Anderson et al.

(10) Patent No.: US 7,735,047 B1
(45) Date of Patent: Jun. 8, 2010

(54) METHOD FOR TECHNOLOGY MAPPING CONSIDERING BOOLEAN FLEXIBILITY

(75) Inventors: Jason H. Anderson, Toronto (CA); Qiang Wang, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 179 days.

(21) Appl. No.: 11/998,337

(22) Filed: Nov. 29, 2007

(51) Int. Cl.
*G06F 17/50* (2006.01)
(52) U.S. Cl. .......................... 716/17; 716/16
(58) Field of Classification Search ............... 716/12–17
See application file for complete search history.

(56) References Cited

U.S. PATENT DOCUMENTS

| 7,100,141 | B1 * | 8/2006 | Ratchev et al. | 716/16 |
| 7,131,098 | B2 * | 10/2006 | Darringer et al. | 716/18 |
| 7,194,723 | B1 * | 3/2007 | Hwang et al. | 716/17 |
| 7,249,329 | B1 * | 7/2007 | Baeckler et al. | 716/3 |

OTHER PUBLICATIONS

Cong et al; On Area/Depth Trade-Off in LUT-Based FPGA Technology Mapping; IEEE Transactions on computer-aided design, vol. 2. No. 2, Jun. 1994, pp. 137-148.*
Andrew Ling et al.; "FPGA Technology Mapping: A Study of Optimality"; DAC 2005; Jun. 13-17, 2005; Copyright 2005 ACM; pp. 1-6.
Ellen M. Sentovich et al.; "Multiple Boolean Relations"; International Workshop on Logic Synthesis; May 1, 1993; pp. 1-13.
Jason Cong et al.; "Cut Ranking and Pruning: Enabling a General and Efficient FPGA Mapping Solution"; In International Symposium on Field-Programmable Gate Arrays; 1999; pp. 29-35.
Alan Mischenko et al.; "SAT=Based Complete Don't-Care Computation for Network Optimization" Proceedings of the Design, Automation and Test in Europe Conference and Exhibition; 2005; IEEE; pp. 412-417.
Shigeru Yamashita et al.; "SPFD: A New Method to Express Functional Flexibility"; IEEE Transactions on Computer Aided Design of Integrated Circuits and Systems; vol. 19, No. 8; Aug. 8, 2000; copyright 2000 IEEE; pp. 840-849.
Robert J. Francis et al.; "Chortle: A Technology Mapping Program for Lookup Table-Based Field Programmable Gate Arrays"; 27th ACM/IEEE Design Automation Conference; Copyright 1990 IEEE; pp. 613-619.
Jason H. Anderson et al.; "Power-Aware Technology Mapping for LUT-Based FPGAs"; IEEE International Conference on Field-Programmable Technology; 2002; Copyright 2002 IEEE; pp. 211-218.
Jason Cong et al.; "FlowMap: An Optimal Technology Mapping, Algorithm for Delay Optimization in Lookup-Table Based FPGA Designs"; IEEE Transactions on Computer-Aided Design of Integrated Circuits and Systems; Jan. 1994; Copyright 1994 IEEE; pp. 1-12.

(Continued)

*Primary Examiner*—Jack Chiang
*Assistant Examiner*—Binh C Tat
(74) *Attorney, Agent, or Firm*—LeRoy D. Maunu; Lois D. Cartier (57) ABSTRACT

Disclosed are processor-implemented methods for technology mapping a logic network onto programmable logic resources of a programmable logic device. The methods include determining respective Boolean flexibility values for a plurality of functionally equivalent mappings of the logic network onto the programmable logic resources, selecting one of the mappings as a function of the respective Boolean flexibility values, and storing the selected mapping.

16 Claims, 5 Drawing Sheets

OTHER PUBLICATIONS

Jason Cong et al.; "On Area/Depth Trade-Off in LUT-Based FPGA Technology Mapping"; IEEE Transaction on VLSI Systems; vol. 2, No. 2; Jun. 1994; Copyright 1994 IEEE; pp. 137-148.

B. Kumthekar et al.; "Power Optimisation of FPGA-Based Designs Without Rewiring"; IEE Proc.-Comput. Digit. Tech.; vol. 147, No. 3; May 2000; pp. 167-174.

* cited by examiner

METHOD FOR TECHNOLOGY MAPPING CONSIDERING BOOLEAN FLEXIBILITY

FIELD OF THE INVENTION

The present invention relates to technology mapping a logic network onto the programmable logic resources of a programmable logic device.

BACKGROUND

The CAD flow for implementing an electronic circuit design on a programmable logic device (PLD) such as a field-programmable gate array (FPGA) generally includes synthesizing a high-level specification of a design into a logic network, optimizing the original logic network, technology mapping the optimized network to logical abstractions of the programmable logic resources that are available on the PLD, and then placing and routing the mapped network on actual instances of the programmable logic resources of the PLD. At various stages of the CAD flow the logic circuit may be optimized for circuit area, number of logic blocks, circuit delay, power and/or routability.

In an example optimization, after the mapped network has been placed and routed the placed-and-routed network may be analyzed in order to improve some desired characteristic of the implemented design. For example, in an FPGA implementation power consumption may be reduced by changing the logic functions implemented by individual lookup tables (LUTs) without changing the overall function of the design. Boolean functional flexibility (or "Boolean flexibility" for short) refers to the ability to change the logic functionality or connectivity of a part of a logic circuit without affecting the functionality of the overall circuit. The Boolean flexibility of those LUTs for which the logic functions may be changed without changing the function of the design is used to improve the placed-and-routed design.

It would be desirable, therefore, to improve the CAD flow to provide further opportunities to optimize an electronic circuit design.

SUMMARY

The present invention provides processor-implemented methods for technology mapping a logic network onto programmable logic resources of a programmable logic device. The methods include determining respective Boolean flexibility values for a plurality of functionally equivalent mappings of the logic network onto the programmable logic resources, selecting one of the mappings as a function of the respective Boolean flexibility values, and storing the selected mapping.

In various embodiments, the step of determining respective Boolean flexibility values includes counting functional options for each functionally equivalent mapping. Determining respective Boolean flexibility values can also include determining functional options for each functionally equivalent mapping, and placing a value on one or more characteristics of the functional options.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

The various embodiments of the present invention provide methods for technology mapping a logic network onto programmable logic resources in such a way as to purposefully consider building Boolean flexibility into the circuit. Considering Boolean flexibility during the technology mapping stage in the design flow allows for selection from among a set of functionally equivalent mappings to provide more freedom to change the specific logic function implemented by the programmable logic resources. This freedom may be exploited in later stages in the design flow, for example to increase circuit performance, reduce power consumption, and so forth. In past efforts, Boolean flexibility was recognized only after the technology mapping stage, and was exploited to the extent that it existed. In the embodiments of the present invention, Boolean flexibility is calculated and considered as part of the technology mapping in order to achieve a greater level of Boolean flexibility than would otherwise be provided.

In technology mapping, the logic circuit being mapped onto the programmable logic device is translated from a network of generic logic functions into a network of logic functions mapped to programmable logic resources available for the target device. For FPGAs, the library of available programmable logic resources typically includes lookup tables (LUTs), registers, multiplexers, and gates. LUTs are small memory devices having K inputs such that a K-input LUT (or K-LUT) can implement any Boolean function having no more than K inputs. For example, a 6-LUT can implement any Boolean function that has six or fewer inputs. While the present invention is suitable for implementation with any programmable logic resources and for any programmable logic device (PLD), the description that follows provides an example application to technology mapping logic circuits onto LUTs of FPGAs.

In technology mapping, a given logic circuit can be mapped into LUTs and registers in many different ways depending on the mapping algorithm, optimization criteria, and so forth. Different technology mapping approaches for FPGAs have focused on criteria such as minimizing the number of LUTs in the mapped circuit, minimizing the depth of LUTs on the longest path in the mapped circuit to minimize circuit delay, reducing both LUT area and depth, and optimizing power and routability. The embodiments of the present invention, however, consider Boolean flexibility earlier in the CAD flow, namely at the technology mapping stage, so that a greater level of Boolean flexibility may be deliberately designed into the circuit. For example, Boolean flexibility can allow the logic function performed by one or more of the LUTs to be changed. Boolean flexibility can also allow connections between LUTs to be changed, added, or removed, and can even allow one or more LUTs to be removed altogether.

When discussing Boolean flexibility, it can be convenient to use Boolean network language. A Boolean network is a directed acyclic graph with nodes that are represented by Boolean functions. The network includes primary inputs and one or more primary outputs. Each node will also have inputs and one or more outputs. The output of a node may be an input to other nodes, which are called its fanouts. The inputs of a node are called its fanins. If there is a path from a node x to a node y, then x is considered to be in the transitive fanin of y, and y is in the transitive fanout of x. The transitive fanin of a node includes the node itself and all nodes in its transitive fanin, including the primary inputs. The transitive fanout of a node includes the node itself and all nodes in its transitive fanout, including the primary output(s). Two different mappings of the same Boolean network, or portion thereof, are said to be functionally equivalent if, for the entire network, the same primary inputs yield the same primary output(s).

A node x is said to be a predecessor of node z if there exists a directed path in the graph from x to z. A successor node is similarly defined. The sub-graph consisting of a node z and all its predecessors is referred to as the subgraph rooted at z (or "cut" rooted at z). For any node z in a network, a K-feasible cone at z, $F_z$, is defined to be a subgraph consisting of z and some of its predecessors such that |input($F_z$)|≦K, where input ($F_z$) represents the set of nodes in the network that, i) are not part of $F_z$, and that ii), have a fanout node in $F_z$. Since a K-LUT can implement any logic function with K or fewer inputs, the technology mapping problem for K-LUTs may be viewed as covering an input Boolean network with K-feasible cones. Generally, there are many K-feasible cones for each node in the network, each having different area, delay, or power characteristics. As a result, the same logic may be mapped into LUTs in many different ways according to the optimization objective, for example, area, delay, power, and now Boolean flexibility.

The Boolean flexibility present in a node of a Boolean network may be represented using Boolean relations, "complete don't cares" (CDCs), and "sets of pairs of functions to be distinguished" (SPFDs). A Boolean relation represents Boolean flexibility of a Boolean network by sets of acceptable output vector patterns for each input vector pattern, as opposed to there being only a single output vector for each input vector. A CDC representation of a node specifies conditions under which the output of the node does not influence the values produced by the primary outputs of the network. CDCs can be important for network optimization because the node's function can be replaced without changing the functionality of the primary outputs of the network. As such, a counting of CDCs in a mapping can be a metric for its Boolean flexibility. SPFDs represent logic functions in terms of input vectors that must be "distinguished," meaning the output value produced by a logic function should differ in order to distinguish the input vectors. The flexibility represented by an SPFD assumes that the internal logic of a node in a circuit can be freely changed. It should be noted that flexibility in Boolean functions is an active research area where new representations may be discovered in the future. The applicability of this invention is not tied to a particular representation of Boolean flexibility.

Figure 1:
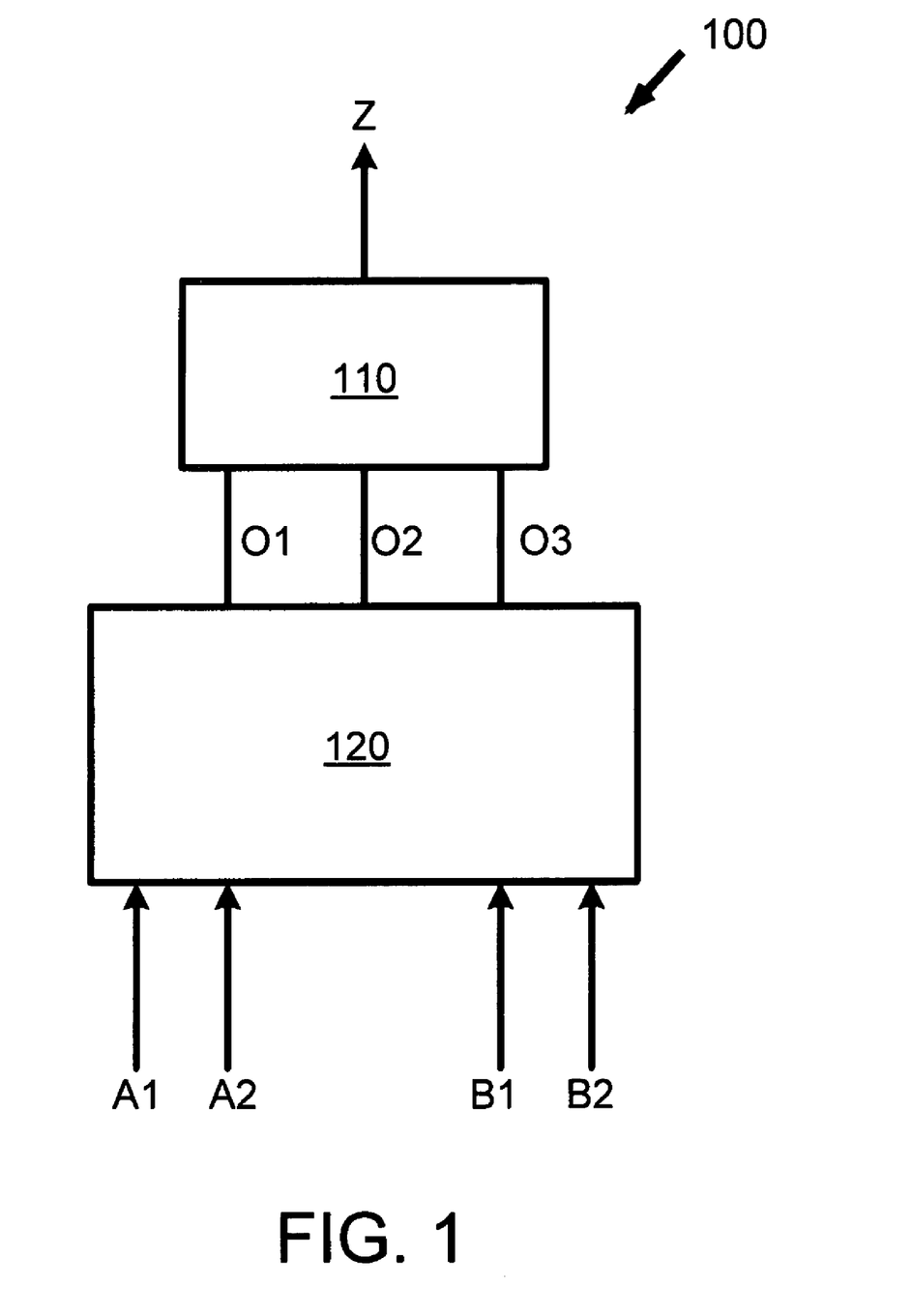
FIG. 1 illustrates a logic circuit having Boolean flexibility.

FIG. 1 illustrates Boolean flexibility that may be present in a logic circuit. Logic circuit 100 includes four inputs A1, A2, B1, B2, and one output Z. The functionality of circuit 100 is partitioned into two sub-circuits 110 and 120. For example, sub-circuit 120 may compute the addition of two 2-bit binary numbers, the first 2-bit binary number being represented by inputs A1 and A2, and the second 2-bit binary number being represented by inputs B1 and B2. Sub-circuit 120 has a 3-bit binary number output represented by intermediate signals O1, O2, O3. Sub-circuit 110 performs a logic function that computes whether the output of sub-circuit 120 is less than 3. That is, if the 3-bit binary number formed by the digits O3/O2/O1 is less than 3, sub-circuit 110 generates a logic-1 as output Z, and otherwise output Z is a logic-0.

Boolean flexibility exists in circuit 100 because sub-circuit 110 returns the same value for many of its input vectors. This allows the functionality of sub-circuit 120 to be changed without changing the overall functionality of the circuit. In particular, sub-circuit 120 can be changed so long as the inputs A1, A2, B1, B2 that produced a 3-bit binary number less than 3 (i.e., 000, 001, or 010) before changing sub-circuit 120 still produce a 3-bit binary number that is less than 3 after changing sub-circuit 120, and so long as the same inputs that produced a 3-bit binary number of 3 or greater (i.e., 011, 100, 101, 110, 111) before the change still produce a 3-bit binary number of 3 or greater after the change, even though the particular combination of bits O3/O2/O1 may be different. The different functional possibilities for sub-circuit 120 may be associated with different physical characteristics, for example, reduced area, lower power, or better speed. In accordance with embodiments of the present invention, Boolean flexibility can be exploited for optimizing the circuit according to a specific goal.

Figure 2A:
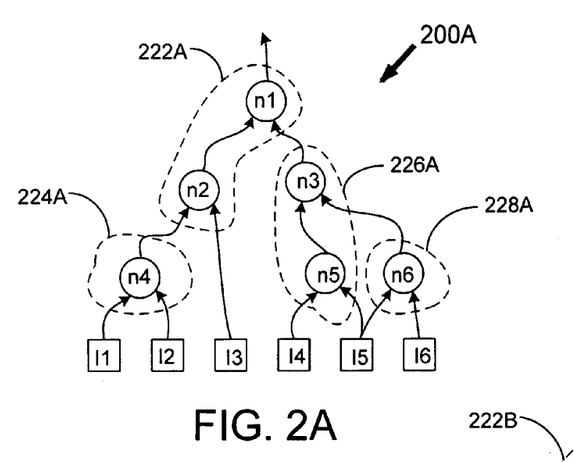
FIGS. 2A-C illustrate different, functionally equivalent mappings of the same logic network.
Figure 2B:
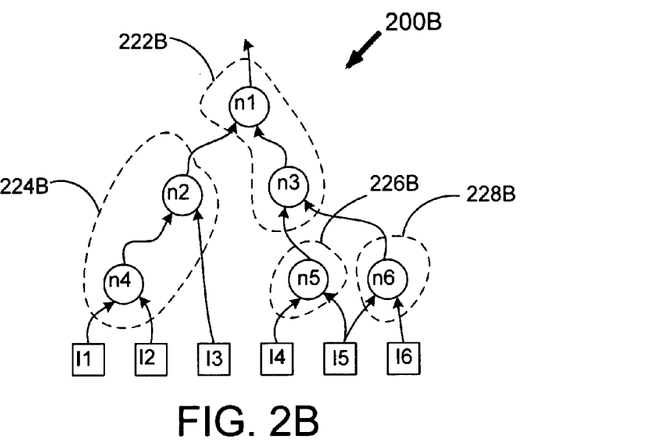
Figure 2C:
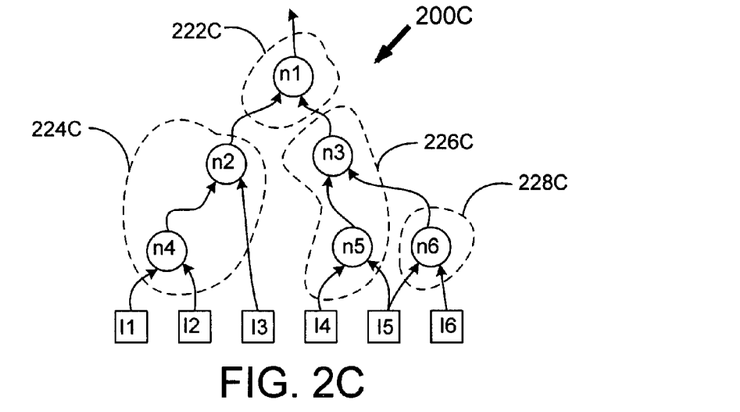

FIGS. 2A-2C illustrate three possible mapping solutions for a logic network of six nodes n1-n6 having six inputs i1-i6 and one output. For purposes of illustration, the target device is an FPGA, and the programmable resources used are 3-input LUTs. FIG. 2A shows one possible mapping 200A that includes LUT 222A covering nodes n1 and n2, LUT 224A covering node n4, LUT 226A covering nodes n3 and n5, and LUT 228A covering node n6. FIG. 2B shows another possible mapping 200B that includes LUT 222B covering nodes n1 and n3, LUT 224B covering nodes n2 and n4, LUT 226B covering node n5, and LUT 228A covering node n6. FIG. 2C shows yet another possible mapping 200C that includes LUT 222C covering node n1, LUT 224C covering nodes n2 and n4, LUT 226C covering nodes n3 and n5, and LUT 228C covering node n6. Note that all three mappings 200A-C use four 3-input LUTs, and therefore have equivalent circuit area costs. However, the mappings 200A-C might not be equivalent in terms of Boolean flexibility. According to an example embodiment, Boolean flexibility values can be generated for each of the mappings, and a mapping can be selected based on the generated values.

As an example, consider LUT 228B in FIG. 2B and LUT 228C in FIG. 2C. In both cases, the LUT covers only node n6 in the logic network. However, the transitive fanout of node n6 is mapped differently in mapping 200B versus mapping 200C. The Boolean flexibility computed for a LUT depends on the successor LUTs in the mapped network, and thus the available freedom for changing the logic functionality of LUT 228B in mapping 200B is likely to be different from that of LUT 228C in mapping 200C. For example, in using Boolean relations as a flexibility model there hypothetically may be four functionally equivalent options for LUT 228B in mapping 200B, whereas mapping 200C might hypothetically provide eight functionally equivalent options for LUT 228C. Knowing a Boolean flexibility value for different, functionally equivalent mappings allows selection based on the Boolean flexibility. Hence, if one of the design goals was to increase the number of available functional options in the final circuit, mapping 200C could be selected over 200B.

The Boolean flexibility for a logic network can be represented in any suitable manner depending on the desired goal of the particular application. As discussed, some models for determining flexibility include using Boolean relations, CDCs, and SPFDs. Each of these models may capture a different amount of functional freedom, and some models may be more beneficial to certain design goals (e.g., power reduction) versus other design goals. A distinguishing feature among various flexibility models is ease of computation. Computing flexibility may be more involved in some models than in others.

One way of costing Boolean flexibility is to count the number of functionally equivalent options according to one or more Boolean flexibility models for each programmable logic resource in the mapped network. An alternative or additional way of costing Boolean flexibility is to look for specific characteristics in the functional options, rather than just counting them. For example, the functional options available for a given programmable logic resource may be examined and a value assigned to each option. The technology mapping solutions containing programmable logic resources having flexibility of high value would be preferred. In the power optimization context, the value of a functional option might be tied to the estimated switching activity associated with that particular Boolean function. Any other suitable way of gauging the value of a functional option is also possible, as will be appreciated by those skilled in the art.

Concretely, one objective might be to leverage Boolean flexibility for power optimization. Dynamic power in CMOS circuits depends on both capacitance and switching activity (toggle rate). Specifically, the power consumed by a net is proportional to the net's routing capacitance multiplied by its switching activity. The different functional options for a LUT will likely have different associated switching activities. Further, a net's capacitance is typically proportional to its fanout. These properties point to an opportunity for optimization, namely, to select technology mapping solutions wherein the LUTs with high fanout have more functionally equivalent options. If, at the end of routing, such LUTs do end up driving high capacitance signals, as predicted, then the different functional options can be explored and the one that delivers the largest power reduction can be selected.

Figure 3:
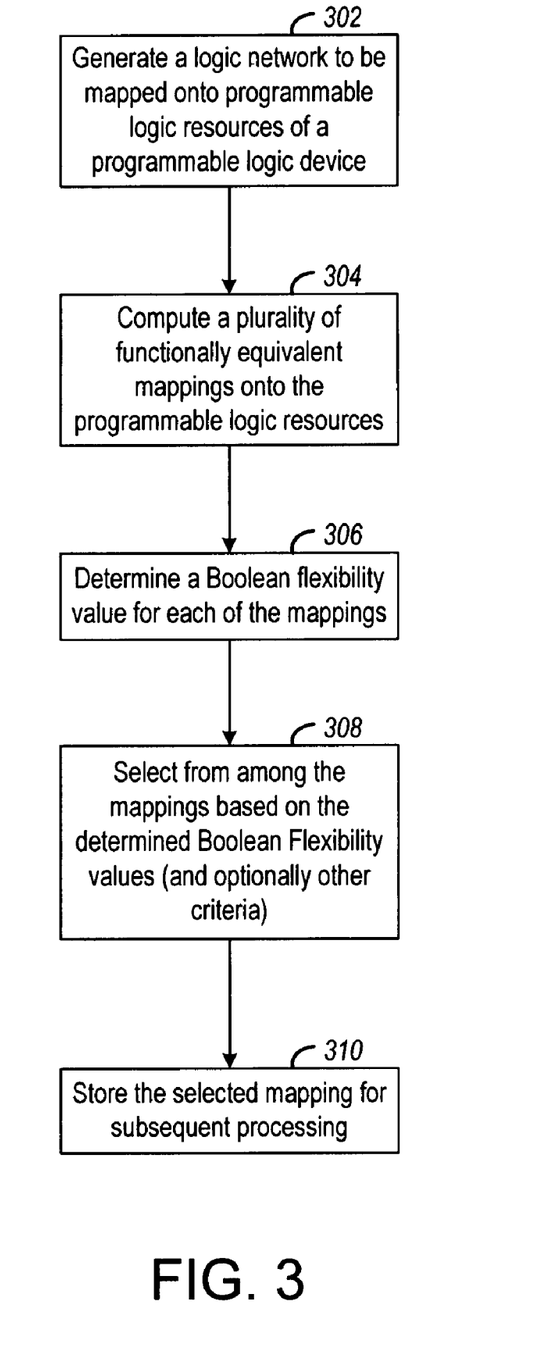
FIG. 3 is a flowchart of an example process for technology mapping a design in accordance with an embodiment of the invention.

FIG. 3 is a flowchart of an example process for technology mapping a design in accordance with an embodiment of the invention. At step 302, a logic network is generated to be mapped onto programmable logic resources of a programmable logic device, such as LUTs or registers of a FPGA. The logic network may be generated by way of synthesizing a high-level design specification using generally available synthesis tools that process designs set forth in a hardware description language (HDL), register transfer language (RTL), schematics, high-level programming languages, etc. A plurality of functionally equivalent mappings of the logic network onto the programmable logic resources can then be computed at step 304. Generally available tools for technology mapping logic networks to specific target devices may be adapted in accordance with the various approaches described herein.

In an example embodiment, a Boolean flexibility value is determined for each of the mappings at step 306. The Boolean flexibility value may be determined as described above using, for example, Boolean relations, CDCs, and/or SPFDs, to determine the Boolean flexibility and then quantifying the Boolean flexibility. Based on the determined Boolean flexibility, a mapping is selected at step 308. Optionally, other criteria for selecting a mapping can also be used, such as total circuit area, circuit performance, and so forth. The selected mapping is stored at step 310 for subsequent processing. Subsequent processing can include, for example, place and route of the mapped logic network. Optionally, at any time during the subsequent processing, the Boolean flexibility designed into the mapping may be exploited by changing the function(s) implemented on one or more programmable logic resources to further optimize the circuit, to satisfy new requirements, and so forth.

Figure 4:
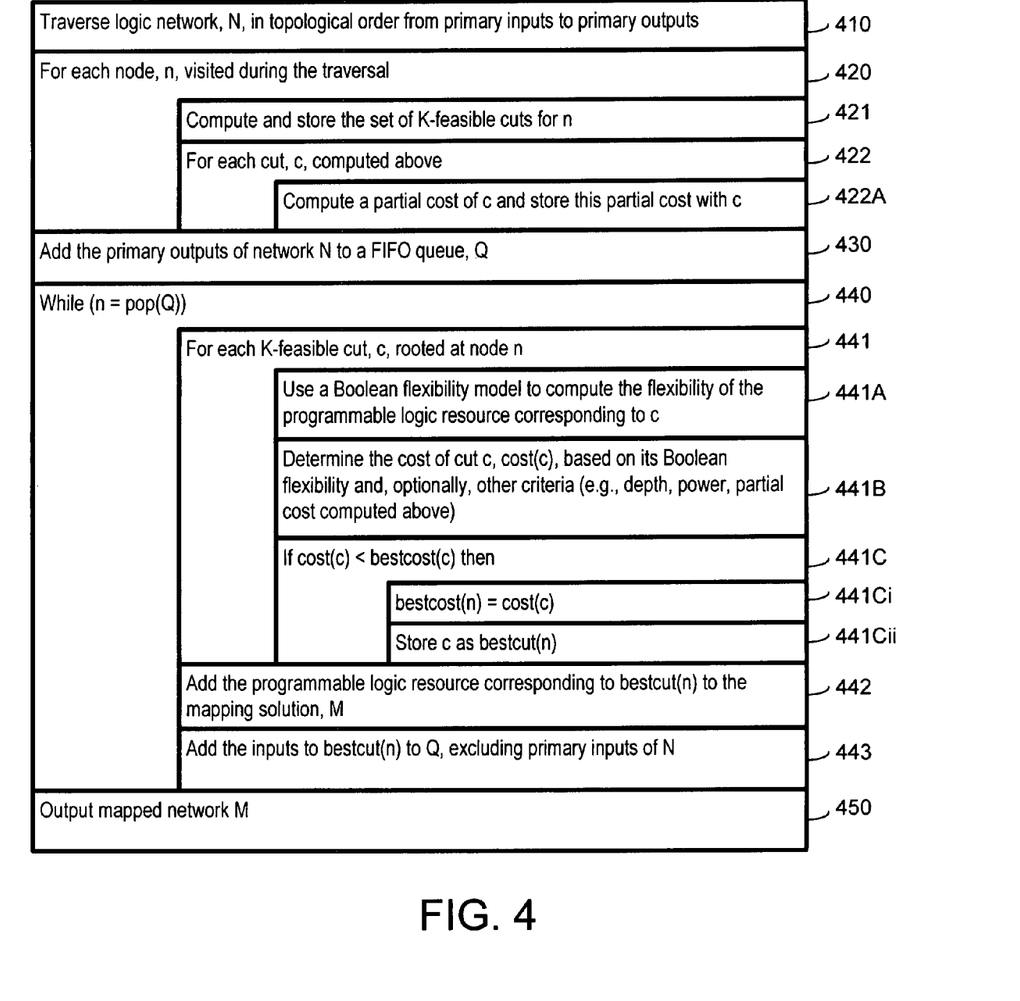
FIG. 4 presents a pseudo-code specification of steps that consider Boolean flexibility during technology mapping onto a programmable logic device in accordance with an embodiment of the invention.

FIG. 4 presents a pseudo-code specification of steps that consider Boolean flexibility during technology mapping onto a programmable logic device in accordance with an embodiment of the invention. The embodiment illustrated in FIG. 4 uses a cut enumeration approach for determining the set of feasible programmable logic resource options for covering the nodes in the Boolean network. The logic network is traversed (step 410) in topological order from its primary inputs to its primary outputs. For each node visited (step 420), the following steps are performed: compute and store the set of feasible cuts for the node (step 421); and for each of these cuts (step 422) compute and store a partial cost of the cut (step 422A). The partial cost of the cut may account for factors such as area (number of LUTs), delay (number of levels of LUTs), estimated power, routability, or combinations of these factors, for example, area-delay product or power-delay product, or other factors altogether.

The primary outputs of the logic network are then added to a first-in first-out (FIFO) queue (step 430). Working through the queue (step 440), for each K-feasible cut generated in step 421, the following steps are performed (step 441): a Boolean flexibility model is used to compute the Boolean flexibility of the programmable logic resource that corresponds to the cut (step 441A); determine the cost of the cut based on its Boolean flexibility and optionally other criteria such as depth, power, the partial cost computed in step 422A, etc. (step 441B); and determine whether the determined cost of the cut is less than the best cost so far (step 441C), and if so then call the determined cost the new best cost (step 441 Ci) and store the cut as the best feasible cut so far (step 441 Cii). When the best feasible cut is determined, a programmable logic resource corresponding to the best feasible cut is added to the technology mapping solution (step 442). The inputs of each of the best feasible cuts can be added to the queue, excluding the primary inputs of the logic network (step 443). Performing these steps generates the fully mapped network, which can be output and stored (step 450).

Figure 5:
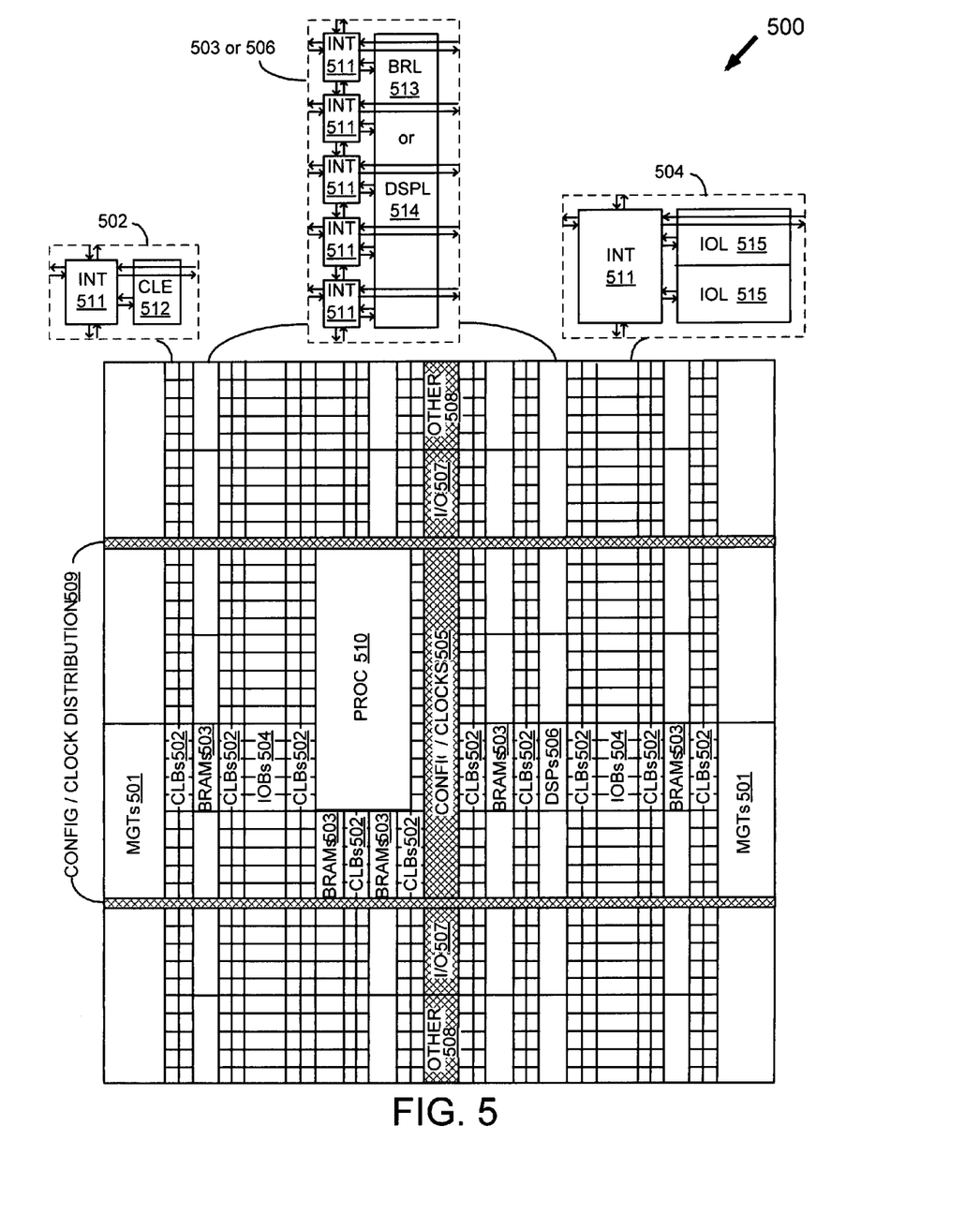
FIG. 5 illustrates an FPGA architecture that includes several different types of programmable logic blocks.

As noted above, while the present invention can be implemented in the technology mapping of any suitable programmable logic resources onto any suitable programmable logic device, it is instructive to consider the case of FPGAs. FPGAs can include several different types of programmable logic blocks in the array. For example, FIG. 5 illustrates an FPGA architecture 500 that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL 514) in addition to an appropriate number of programmable interconnect elements. An 10B 504 can include, for example, two instances of an input/output logic element (IOL 515) in addition to one instance of the programmable interconnect element (INT 511). As will be clear to those of skill in the art, the actual I/O pads connected, for example, to the I/O logic element 515 typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate an example FPGA architecture. The numbers of logic blocks in a column, the relative width of the columns, the number and order of columns, the types of logic blocks included in the columns, the relative sizes of the logic blocks, and the interconnect/logic implementations included at the top of FIG. 5 are examples. For example, in an actual FPGA more than one adjacent column of CLBs is typically included wherever the CLBs appear, to facilitate the efficient implementation of user logic, but the number of adjacent CLB columns varies with the overall size of the FPGA.

Those skilled in the art will recognize various modifications and additions that may be made as a result of the present disclosure. For example, the described embodiments are in the context of programmable logic devices such as FPGAs. However, the methods and structures of the invention can also be implemented for targeting other types of programmable logic devices, e.g., CPLDs, PLAs, PALs, and so forth. The methods and structures of the invention can also apply to any integrated circuit (IC) that includes programmable resources.

Those skilled in the art will appreciate that various alternative computing arrangements, including one or more processors and a memory arrangement configured with program code, would be suitable for hosting and storing the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for technology mapping. Other aspects and embodiments of the present invention will be apparent to those skilled in the art from consideration, of the specification and practice of the invention disclosed herein. It is intended that the specification and illustrated embodiments be considered as examples only, with a true scope and spirit of the invention being indicated by the following claims.

What is claimed is:

1. A processor-implemented method for technology mapping a logic network onto programmable logic resources of a programmable integrated circuit, the method comprising:
   determining respective Boolean flexibility values for a plurality of functionally equivalent mappings of the logic network onto the programmable logic resources;
   wherein the determining respective Boolean flexibility values includes counting, for one or more programmable logic resources in each mapping, a number of functionally equivalent options of the one or more programmable logic resources in the mapping, and the respective Boolean flexibility value is at least in part a function of the number of functionally equivalent options;
   selecting one of the mappings as a function of the respective Boolean flexibility values; and
   storing the selected mapping in an electronic storage device wherein the determining respective Boolean flexibility values comprises determining the functionally equivalent options for each functionally equivalent mapping, and placing a value on one or more characteristics of the functionally equivalent options.

2. The method of claim 1, wherein the programmable integrated circuit comprises a field-programmable gate array.

3. The method of claim 2, wherein the programmable logic resources include lookup tables.

4. The method of claim 2, wherein the programmable logic resources include multiplexers.

5. The method of claim 2, wherein the programmable logic resources include registers.

6. The method of claim 2, wherein the programmable logic resources include gates.

7. The method of claim 1, wherein the counting functionally equivalent options is based at least in part on Boolean relations.

8. The method of claim 1, wherein the counting functionally equivalent options is based at least in part on complete-don't-cares.

9. The method of claim 1, wherein the counting functionally equivalent options is based at least in part on sets-of-pairs-of-functions-to-be-distinguished.

10. The method of claim 1, wherein the one or more characteristics include estimated switching activity.

11. The method of claim 1, further comprising determining circuit area cost values for the plurality of functionally equivalent mappings of the logic network onto the programmable logic resources.

12. The method of claim 11, wherein the selecting further includes selecting as a function of the respective circuit area cost values.

13. The method of claim 1, further comprising determining circuit performance values for the plurality of functionally equivalent mappings of the logic network onto the programmable logic resources.

14. The method of claim 13, wherein the selecting further includes selecting as a function of the respective circuit performance values.

15. An apparatus for technology mapping a logic network onto programmable logic resources of a programmable integrated circuit, comprising:
   means for determining respective Boolean flexibility values for a plurality of functionally equivalent mappings of the logic network onto the programmable logic resources;

wherein the means for determining respective Boolean flexibility values includes means for counting, for one or more programmable logic resources in each mapping, a number of functionally equivalent options of the one or more programmable logic resources in the mapping, and the respective Boolean flexibility value is at least in part a function of the number of functionally equivalent options;

means for selecting one of the mappings as a function of the respective Boolean flexibility values; and means for storing the selected mapping wherein the determining respective Boolean flexibility values comprises means for determining the functionally equivalent options for each functionally equivalent mapping, and placing a value on one or more characteristics of the functionally equivalent options.

16. An article of manufacture, comprising:

a processor-readable storage medium configured with executable instructions for technology mapping a logic network onto programmable logic resources of a programmable integrated circuit, wherein in executing the instructions one or more processors perform steps including:

determining respective Boolean flexibility values for a plurality of functionally equivalent mappings of the logic network onto the programmable logic resources;

wherein the determining respective Boolean flexibility values includes counting, for one or more programmable logic resources in each mapping, a number of functionally equivalent options of the one or more programmable logic resources in the mapping, and the respective Boolean flexibility value is at least in part a function of the number of functionally equivalent options;

selecting one of the mappings as a function of the respective Boolean flexibility values; and storing the selected mapping, wherein the determining respective Boolean flexibility values comprises determining the functionally equivalent options for each functionally equivalent mapping, and placing a value on one or more characteristics of the functionally equivalent options.

* * * * *